MIXED-CRYSTAL THERMOELECTRIC COMPOSITION
Filed July 25, 1962
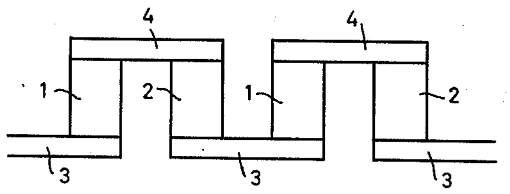

United States Patent Office 3,211,656

Patented Oct. 12, 1965

3,211,656
MIXED-CRYSTAL THERMOELECTRIC COMPOSITION

Joachim Rupprecht, Nurnberg, Germany, assignor to Siemens-Schuckertwerke Aktiengesellschaft, Berlin-Siemensstadt, Germany, a corporation of Germany Filed July 25, 1962, Ser. No. 212,411
Claims priority, application Germany, July 29, 1961, S 75,091
7 Claims. (Cl. 252—62.13)

My invention relates to mixed-crystal semiconductor devices and is described herein with reference to the accompanying drawing which shows schematically an example of a semiconductor thermocouple in accordance with my invention.

In a more specific aspect, my invention concerns semiconductor devices which comprise a semiconductor body constituted by a mixed-crystal of an $A^{IV}B^{VI}$ compound and of an $A^{I}B^{V}C_2^{VI}$ compound, these binary and ternary terminal compounds being of the intermetallic type and composed of elements from the *b*-groups of the periodic system identified by the superscripts I, IV, V and VI. It is known that the $A^{IV}B^{VI}$ compounds are suitable for technological utilization of the Peltier effect in the electric production of cold. On the other hand, ternary compounds of the type $A^{I}B^{V}C_2^{VI}$, for example $AgSbTe_2$, have also become known as suitable for similar purposes.

As is disclosed in the copending application Serial No. 856,087, filed November 30, 1959 by O. Folberth, which issued as Patent No. 3,140,998 on July 14, 1964, and is assigned to the assignee of the present invention, the properties of the above-mentioned groups of compounds can be combined by mixed-crystal formation with the result of improving their suitability for thermoelectric purposes. For example, the thermal conductance can thus be reduced to values lower than those obtainable with the respective terminal compounds. Particularly favorable results in this respect have heretofore been obtained by partially substituting one or more of the individual mixed-crystal components by another component from the same *b*-group of the periodic system. In the most general case, the formula of such a mixed-crystal, as stated in the above-mentioned copending application, is as follows:

$$[(A^{I}_{xy/2}\,B^{I}_{x/2(1-y)})(C^{IV}_{(1-x)z}\,D^{IV}_{(1-x)(1-z)})(E^{V}_{xt/2}\,F^{V}_{x/2(1-t)})][G^{VI}_{u}\,H^{VI}_{1-u}]$$

wherein $0<(x,y,z,t,u,)<1$.

It is an object of my invention to provide mixed-crystal semiconductor devices of still better thermoelectric effectivity values than heretofore obtained.

Another object of my invention is to devise a thermoelectric composition formed by mixed-crystals of intermetallic compounds which lends itself with particular advantage to the thermoelectric generation of electric current at elevated temperatures such as 20° to 500° C. and which, in this temperature range, affords an improved median effectivity.

Still another object of my invention is to achieve one or more of the above-mentioned improvements with the aid of metallic compositions that are susceptible to a relatively easy method of manufacture and fabrication.

According to my invention, the crystalline semiconductor body of an electronic semiconductor device is formed of a mixed-crystal (solid solution) of silver, lead, germanium, antimony and tellurium in the following proportions:

$$(Ag_{x/2}Pb_{(1-x)(1-y)}Ge_{(1-x)y}Sb_{x/2})\ Te$$

wherein $0<x,y<1$.

It will be understood that the values of $x$ and $y$ in this formula must be appreciably greater than zero and appreciably smaller than unity so that a true five-component mixed-crystal is obtained whose thermoelectrically significant properties, discussed hereinbelow, are distinct from the corresponding properties of the terminal compounds. The composition of the mixed-crystal is stoichiometric in the sense that the number of atoms of Te is substantially equal to the sum of the atoms of all other four components.

Mixed crystal bodies according to the invention are particularly advantageous when used as thermoelectric elements so that the mixed-crystal according to the invention constitutes a leg of p-type conductance in a thermocouple for the purpose of obtaining a relatively high specific electric power conjointly with a relatively small heat conductance.

That is, mixed-crystals according to the invention are specially suitable for use in thermoelectric generators where it is desirable to produce a relatively high specific electric power and to have a relatively low heat conductance within the generator, within a largest feasible temperature range above normal room temperature of 20° C.

The mixed-crystals according to the invention are superior to the mixed-crystals heretofore known with respect to the value of the median thermoelectric effectivity $$z_m=\frac{\alpha_m^2\sigma_m}{\kappa_m}$$

within the temperature range of about 20 to about 500° C. while operating with a substantially linear temperature drop. In the formula, $\alpha_m$=median differential thermoforce
$\sigma$=median electrical conductance
$\kappa_m$=median heat conductance Reference to these particular mixed-crystals will be made in the following description in conjunction with the accompanying drawing which shows by way of example a thermopile whose individual legs 1 and 2 consist of mixed-crystals according to the invention having respectively different thermoforces. The members 1 and 2 may consist of one and the same mixed-crystal substance except that the members 1 are doped for p-type conductance and the legs 2 have n-type conductance. The legs are joined together by copper bars 3 and 4. The device of FIG. 1 is suitable, for example as a voltage generator. Similar devices are also applicable for cooling purposes. The choice of the materials for the thermocouple legs is in accordance with known principles and may include a material other than corresponds to the present invention for one of the two legs of each couple.

It will be recognized that the five-element substances according to the invention are mixed-crystals of the two semiconducting mixed-crystals or terminal compounds $(Ag_{x/2}Pb_{1-x}Sb_{x/2})$ Te, wherein $0<x<1$, and $$(Ag_{x/2}Ge_{1-x}Sb_{x/2})\ Te$$

wherein $0<x<1$. I have discovered that in the above-mentioned temperature range of about 20° to about 500° C. the five-element mixed-crystal possesses a higher median thermoelectric effectivity value than the terminal mixed crystals.

The particularly favorable average value of effectivity $z_m$ renders the mixed-crystals according to the invention especially suitable for use in thermoelectric generators to operate in the temperature range of 20 to 500° C. However, it has been another, surprising discovery that by varying the composition relative to the mixed-crystal $(Ag_{x/2}Pb_{1-x}Sb_{x/2})$ Te, the five-element crystals according to the invention simultaneously possess a higher electrical conductance.

When producing mixed-crystals from an $A^{IV}B^{VI}$ compound and an $A^{I}B^{V}C_2^{VI}$ compound, some difficulties are encountered during zone melting because of the presence of foreign phases. Against expectation, these difficulties have been found to be considerably reduced in the production of mixed-crystals according to my invention, despite the fact that these mixed-crystals can be looked upon as being composed of two $A^{IV}B^{VI}$ compounds and an $A^{I}B^{V}C_2^{VI}$ compound. Analogously, the mixed-crystals according to the invention can be homogenized much more readily, for example by zone levelling. The inclusions of foreign phases are smaller than with the known mixed-crystals.

The mixed-crystals according to the invention can be produced from the elemental substances by melting them together in the conventional manner, for example in a closed and sealed vessel, preferably under exclusion of oxygen or in vacuum.

Mixed-crystals of the following compositions have been found particularly favorable for use in thermoelectric semiconductor devices:

(1) $(Ag_{x/2}Pb_{(1-x)(1-y)}Ge_{(1-x)y}Sb_{x/2})$ Te, $0.35 \leq x \leq 0.75$ and $0.2 \leq y \leq 0.8$ (2) $(Ag_{x/2}Pb_{(1-x)(1-y)}Ge_{(1-x)y}Sb_{x/2})$ Te, $x=0.42$ and $y=0.518$ (3) $(Ag_{x/2}Pb_{(1-x)(1-y)}Ge_{(1-x)y}Sb_{x/2})$ Te, $x=0.526$ and $y=0.525$ (4) $(Ag_{x/2}Pb_{(1-x)(1-y)}Ge_{(1-x)y}Sb_{x/2})$ Te, $x=0.64$ and $y=0.556$ The invention will be further described with reference to the following examples.

EXAMPLE I ($x=0.42$ and $y=0.518$)

The five components were used in pulverulent form and in at least 99.99% purity. The following amounts were weighed for a total quantity of 50 g.:

Ag=4.4311 g.
Pb=11.3480 g.
Sb=5.0012 g.
Ge=4.2600 g.
Te=24.9595 g.

The components were placed into a quartz ampule of elongated shape. Alternatively, they could have been placed into an elongated quartz crucible which was placed into an ampule. In either case, the ampule was evacuated and fused off, the vacuum being $10^{-5}$ mm. Hg. Thereafter the compound was melted at 900° C. and was thereafter permitted to freeze and crystallize. Subsequently, the specimen was zone-melted in forward and reverse direction while being kept in the evacuated and fused-off quartz ampule. The zone temperature used was 800° C., and the pulling rate was 6 cm. per hour. The resulting mixed-crystal has a round cross section corresponding to that of the ampule and a diameter of 10 mm. The properties of the specimen were measured and are reported in the following tabulation in the column marked I.

EXAMPLE II ($x=0.526$ and $y=0.525$)

For a total quantity of 50 g., the five components were weighed as follows:

Ag=5.5958 g.
Pb=9.2303 g.
Sb=6.3158 g.
Ge=3.5933 g.
Te=25.2645 g.

The compound was melted from the pure elements (99.99%). The melting was effected as described in Example I in a quartz ampule evacuated to $10^{-5}$ mm. Hg. at a temperature of 900° C. Thereafter the specimen was homogenized by zone melting in forward and reverse direction within the evacuated and sealed quartz ampule. The zone temperature was 750° C., the zone-pulling rate was 6 cm. per hour. The measured properties of the specimen are reported in the following tabulation in the column marked II.

EXAMPLE III ($x=0.64$ and $y=0.556$)

The following quantities, computed for a total of 50 g., were weighed:

Ag=6.9384 g.
Pb=6.6638 g.
Sb=7.8311 g.
Ge=2.9183 g.
Te=25.6481 g.

The pure components were melted together in the same equipment, at the same pressure and the same temperature as in Examples I and II. The zone temperature was 750° C., and the zone-pulling rate was 6 cm. per hour.

The following tabulation indicates the median thermoelectric data for the mixed-crystals according to Examples I, II and III in the temperature range of 20° to 500° C.

*Table*

| Examples | I | II | III |
|---|---|---|---|
| Median differential thermoforce, $\alpha_m[\mu V./° C.]$ | 225 | 235 | 238 |
| Median specific electric resistance, $\rho_m[\Omega$ cm.] | $3.6 \cdot 10^{-3}$ | $4.0 \cdot 10^{-3}$ | $4.6 \cdot 10^{-3}$ |
| Median thermal conductance, $\kappa_m$[W/cm. degree] | $0.5 \cdot 10^{-2}$ | $0.47 \cdot 10^{-2}$ | $0.43 \cdot 10^{-2}$ |
| Median thermoelectric effectivity, $Z_m$ [degree$^{-1}$] | $2.8 \cdot 10^{-3}$ | $2.9 \cdot 10^{-3}$ | $2.8 \cdot 10^{-3}$ |

The tabulated values were obtained by taking the average over the temperature range of 20° to 500° C. The tabulated values are more favorable for technological application than the best median effectivities heretofore known as follows:

$z_m=2.6 \cdot 10^{-3}$[degree$^{-1}$] for the mixed-crystal $(Ag_{0.4}Pb_{0.2}Sb_{0.4})$ Te, and $z_m=1.2 \cdot 10^{-3}$[degree$^{-1}$] for the mixed-crystals $(Ag_{x/2}Ge_{1-x}Sb_{x/2})$ Te, $0.1 \leq x \leq 0.8$.

I claim:

1. A semiconductor body consisting of the mixed-crystal $(Ag_{x/2}Pb_{(1-x)(1-y)}Ge_{(1-x)y}Sb_{x/2})$ Te, wherein $0.35 \leq x \leq 0.75$ and $0.2 \leq y \leq 0.8$.

2. A semiconductor body, formed of the mixed-crystal $(Ag_{x/2}Pb_{(1-x)(1-y)}Ge_{(1-x)y}Sb_{x/2})$ Te, wherein $x$ is substantially equal to 0.42 and $y$ is substantially equal to 0.518.

3. A semiconductor body, formed of the mixed-crystal $(Ag_{x/2}Pb_{(1-x)(1-y)}Ge_{(1-x)y}Sb_{x/2})$ Te, wherein $x$ is substantially equal to 0.526 and $y$ is substantially equal to 0.525.

4. A semiconductor body, formed of the mixed-crystal $(Ag_{x/2}Pb_{(1-x)(1-y)}Ge_{(1-x)y}Sb_{x/2})$ Te, wherein $x$ is substantially equal to 0.64 and $y$ is substantially equal to 0.556.

5. A semiconductor member for thermoelectric purposes comprising a thermocouple leg having p-type conductance and being formed of the semiconducting mixed-crystal $(Ag_{x/2}Pb_{(1-x)(1-y)}Ge_{(1-x)y}Sb_{x/2})$ Te, wherein $0.35 \leq x \leq 0.95$ and $0.05 \leq y \leq 0.95$.

6. The method of producing a semiconductor member, which comprises melting in a sealed vessel the constituents: $(Ag_{x/2}Pb_{(1-x)(1-y)}Ge_{(1-x)y}Sb_{x/2})$ Te, wherein $0.35 \leq x \leq 0.75$ and $0.2 \leq y \leq 0.08$, the melting being effected with substantially stoichiometric quantities of said constituents, and thereafter permitting the melt to crystallize in the sealed vessel.

7. The method of producing a semiconductor member, which comprises melting in a sealed vessel the constituents: $(Ag_{x/2}Pb_{(1-x)(1-y)}Ge_{(1-x)y}Sb_{x/2})$ Te, wherein $0.35 \leq x \leq 0.75$ and $0.2 \leq y \leq 0.08$, the melting being effected with substantially stoichiometric quantities of said constituents, permitting the melt to cool and crystallize in the vessel, and subjecting the crystallized product in the still sealed vessel to zone melting.

References Cited by the Examiner

RCA Laboratories, Thermoelectric Materials for Power Generation, "Tellurides," pages 26–30, reproduced by ASTIA Arlington Hall Station, Arlington, Va., 1962, AD291456.

Wernick: "Metallurgy of Some Ternary Semiconductors and Constitution of the $AgSbSe_2$-$AgSbTe_2$-$AgBiSe_2$-PbSe-PbTe System," article in Properties of Elemental and Compound Semiconductors, edited by Gatos, Interscience Publishers, New York, 1960, pages 69–86.

TOBIAS E. LEVOW, *Primary Examiner.*

MAURICE A. BRINDISI, *Examiner.*